(12) United States Patent
Chen et al.

(10) Patent No.: US 9,536,757 B2
(45) Date of Patent: Jan. 3, 2017

(54) DEVICE MANUFACTURING CLEANING PROCESS USING VAPORIZED SOLVENT

(71) Applicant: Taiwan Semiconductor Manufacturing Company, Ltd., Hsin-Chu (TW)

(72) Inventors: Albert Po Chia Chen, Zhubei (TW); Kuo-Sheng Chuang, Hsinchu (TW); Chi-Ming Yang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 506 days.

(21) Appl. No.: 14/020,526

(22) Filed: Sep. 6, 2013

(65) Prior Publication Data

US 2015/0068559 A1    Mar. 12, 2015

(51) Int. Cl.
| | |
|---|---|
| *B08B 5/00* | (2006.01) |
| *H01L 21/67* | (2006.01) |
| *H01L 21/02* | (2006.01) |
| *B08B 3/04* | (2006.01) |

(52) U.S. Cl.
CPC ... *H01L 21/67051* (2013.01); *H01L 21/02057* (2013.01); *H01L 21/67028* (2013.01); *B08B 3/04* (2013.01)

(58) Field of Classification Search
CPC ............... H01L 21/67051; H01L 21/02057; H01L 21/67028; B08B 3/04
See application file for complete search history.

(56) References Cited

U.S. PATENT DOCUMENTS

| | | | |
|---|---|---|---|
| 2003/0015217 A1* | 1/2003 | Gale | B08B 7/0014 134/1.3 |
| 2007/0221254 A1* | 9/2007 | Izumi | H01L 21/02041 134/26 |
| 2013/0068257 A1* | 3/2013 | Tomita | H01L 21/67028 134/19 |
| 2013/0167877 A1* | 7/2013 | Fujiwara | B08B 3/04 134/26 |
| 2015/0200086 A1* | 7/2015 | Yokoyama | F26B 3/00 34/412 |

* cited by examiner

*Primary Examiner* — Bibi Carrillo
(74) *Attorney, Agent, or Firm* — Slater Matsil, LLP

(57) ABSTRACT

A cleaning method using vaporized solvent is provided. A solvent-containing vapor is generated, wherein the solvent-containing vapor comprises a solvent. The solvent-containing vapor is conducted to a substrate having debris or contaminants to clean the substrate, wherein the solvent-containing vapor condenses to form a liquid on a surface of the substrate. The liquid phase of the solvent-containing vapor is changed to a solid phase. The solid phase of the solvent-containing vapor is changed back to a liquid phase. The substrate is spun dried to remove the solvent-containing vapor in liquid phase and any debris or contaminants.

20 Claims, 4 Drawing Sheets

DEVICE MANUFACTURING CLEANING PROCESS USING VAPORIZED SOLVENT

BACKGROUND

Semiconductor devices are produced and used throughout the world in electronic and various other types of devices. Semiconductor devices are formed on semiconductor chips, and are often referred to as chips, which include millions of features and components that combine to form an integrated circuit or other semiconductor device. There is a constant push to increase integration levels of semiconductor devices by including more components on a chip of a given size, so that the increased functionality can be achieved on each semiconductor device chip. As such, semiconductor device features continue to shrink and there is an ongoing drive to shrink features and components further. One aspect of feature sizes that continue to shrink is the production of high aspect ratio features on or in a substrate.

For example, the lateral dimensions of holes, trenches, gaps, or other features that extend downwardly into a substrate or into a film or films formed over a substrate, continue to shrink. Advanced processing techniques allow for these holes, trenches, or gaps with shrinking lateral dimensions to be formed deeper and deeper into substrates or film or films formed above the substrates. As such, the aspect ratio continues to become greater.

Practically every substrate upon which semiconductor devices are being formed undergoes multiple wet processing operations. The wet processing operations include cleaning operations and etching operations. As the aspect ratio of holes, trenches, or gaps formed on or over the substrate become greater, it becomes increasingly more difficult for the cleaning or etching solvents to extend downward to completely fill the holes, trenches, or gaps and the efficiency of the cleaning process becomes lower. If the etching or cleaning solvent does not extend to the bottom of the holes, trenches, or gaps, undesirable residue or debris can remain after cleaning operations and undesirable material intended to be etched, can remain after etching operations. This is due, at least in part, to surface tension of the solvent liquid that is introduced onto the surface as an etching or cleaning fluid, and can also be due to reaction products or by-products.

There is also a solid-air surface tension on the surface of the substrate that can result in voids, i.e. air bubbles, when a substrate is undergoing wet processing. This results in small areas on the substrate that are not reached by the solvent liquid.

Also, it is difficult for the wet solvent that is used in the cleaning or etching process to flow into and out of voids or openings that may exist in microscopic residue, debris, or contaminants on the substrate.

To enhance the particle removal efficiency, some cleaning methods use physical force, such as megasonic power, ultrasonic power, or fluid jet to assist the solvent in removing undesirable residue. However, the physical force or pressure from the sprayed solvent may cause lateral damage, such as pattern collapse (e.g., photoresist layer or permanent layer), especially in advance node devices.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

Figure 1:
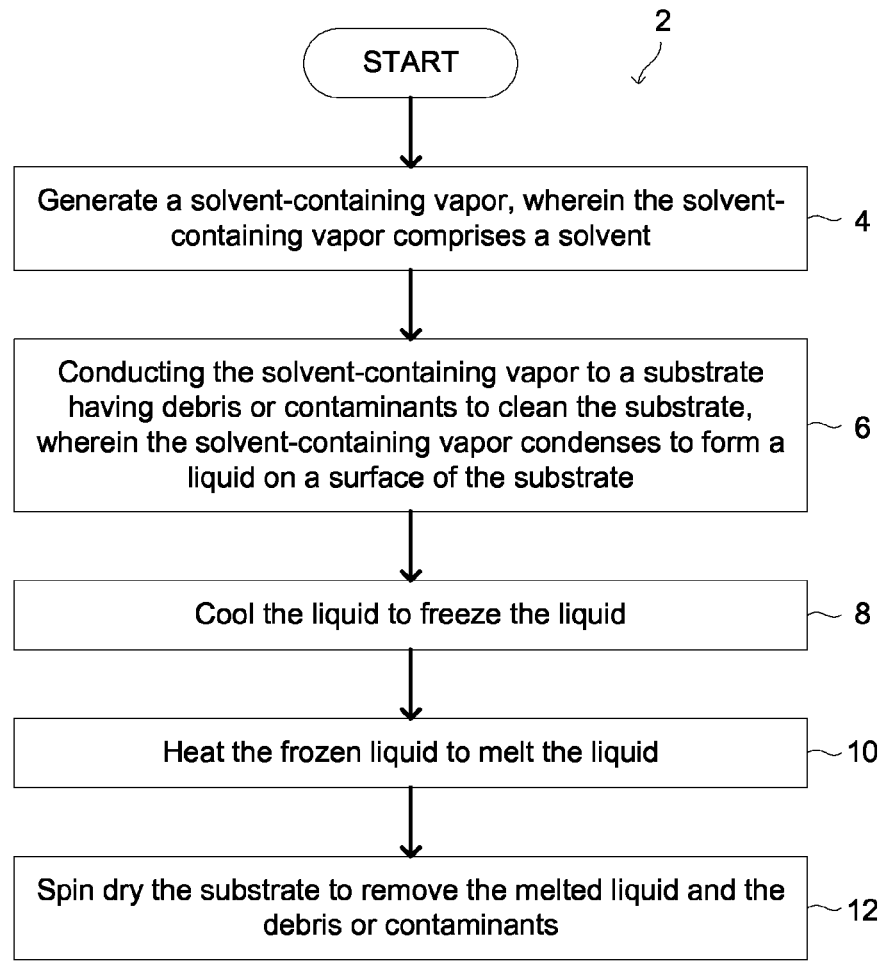
FIG. 1 is a flowchart of one embodiment of a method for cleaning a structure according to various aspects of the present disclosure.

FIG. 1 is a flowchart of one embodiment of a method 2 for cleaning a structure according to various aspects of the present disclosure. Referring to FIG. 1, the method 2 includes block 4, in which a solvent-containing vapor is generated, where the solvent-containing vapor comprises a solvent. The method 2 includes block 6, in which the solvent-containing vapor is conducted to a substrate having debris or contaminants to clean the substrate. The solvent-containing vapor condenses to form a liquid on a surface of the substrate. The method 2 includes block 8, in which the liquid is cooled to freeze it. The method 2 includes block 10, in which the frozen liquid is heated in order to melt the liquid. The method 2 includes block 12, in which the substrate is spun dried to remove the melted liquid and the debris or contaminants.

It is understood that additional processes may be performed before, during, or after the blocks 4-12 shown in FIG. 1 to complete the cleaning of the structure, but these additional processes are not discussed herein in detail for the sake of simplicity.

FIGS. 2-7 are diagrammatic fragmentary cross-sectional side views of a semiconductor structure 100 at various wet processing stages according to embodiments of the method 2 of FIG. 1. It is understood that FIGS. 2-7 have been simplified for a better understanding of the inventive concepts of the present disclosure. It should be appreciated that the processing solutions, materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Figure 2:
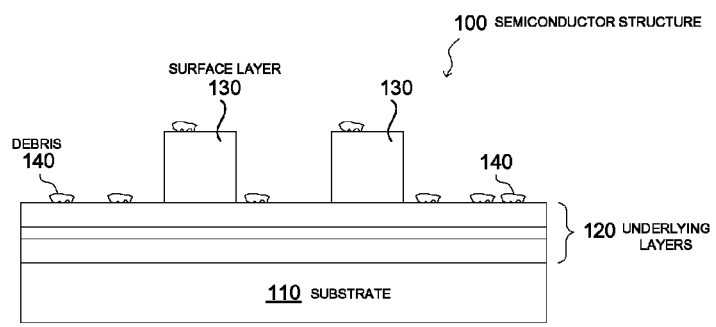
FIG. 2 is a cross-sectional view of one embodiment of a semiconductor structure in a cleaning process according to various aspects of the present disclosure.

Referring to FIG. 2, the semiconductor structure 100 includes a semiconductor wafer. It is understood that the semiconductor structure 100 may be any structure that may benefit from the present disclosure. Further, it is understood that the semiconductor structure 100 may include various devices and features, such as other types of transistors such as bipolar junction transistors, resistors, capacitors, diodes, fuses, etc. Additional features can be added in the semiconductor structure 100, and some of the features described below can be replaced or eliminated in other embodiments of the semiconductor structure 100.

The semiconductor structure 100 includes a substrate 110. In the present embodiment the substrate 110 is a substrate of a semiconductor wafer. The substrate 110, for example, includes an elementary semiconductor, such as silicon or germanium in a crystalline structure; a compound semiconductor, such as silicon germanium, silicon carbide, gallium arsenic, gallium phosphide, indium phoshide, indium arsenide, and/or indium antimonide; or combinations thereof.

Formed over a surface of substrate 110 are one or more underlying layers 120 including various materials such as conductive materials and dielectric materials. The underlying layers 120 can include patterned or unpatterned layers. Forming the underlying layers 120 may include single or multiple patterning and deposition processes, etching processes, chemical mechanical polishing (CMP) processes, a combination of these processes, or any other suitable process.

Still referring to FIG. 2, formed over the underlying layers 120 is a surface layer 130. The surface layer 130 may be a patterned or an unpatterned layer. Depending on the purpose of the surface layer 130, the surface layer 130 may include a dielectric material, a conductive material, a combination thereof, or any other suitable material. Forming the surface layer 130 may include single or multiple patterning and deposition processes, wet/dry etching processes, chemical mechanical polishing (CMP) processes, a combination of these processes, or any other suitable process. In one embodiment, the surface layer 130 is a photoresist layer patterned by any suitable process. Patterning the photoresist layer may include exposing the photoresist layer to a pattern, performing a post-exposure bake process, and developing the photoresist layer thereby forming a patterned photoresist layer. The patterning may also be implemented or replaced by other proper methods, such as maskless photolithography, electron-beam writing, ion-beam writing, and molecular imprint. As such, the surface layer 130 (photoresist) is a temporary layer used in processing of the final device and which will ultimately be removed. It is understood that the surface layer 130 may be a permanent layer that will be included in a final device and may be formed of and/or include any other suitable conductive and/or dielectric materials, according to design requirements.

After the formation of the patterned surface layer 130, contamination debris 140 such as organic particles, particles from the patterned surface layer 130, particles from other layers, particles from processing solutions, or other unwanted contaminants may be present on exposed surfaces of the surface layer 130 or on exposed surfaces of the underlying layers 120. The debris 140 may be evenly or unevenly disbursed on all or some of the exposed surfaces.

Figure 3:
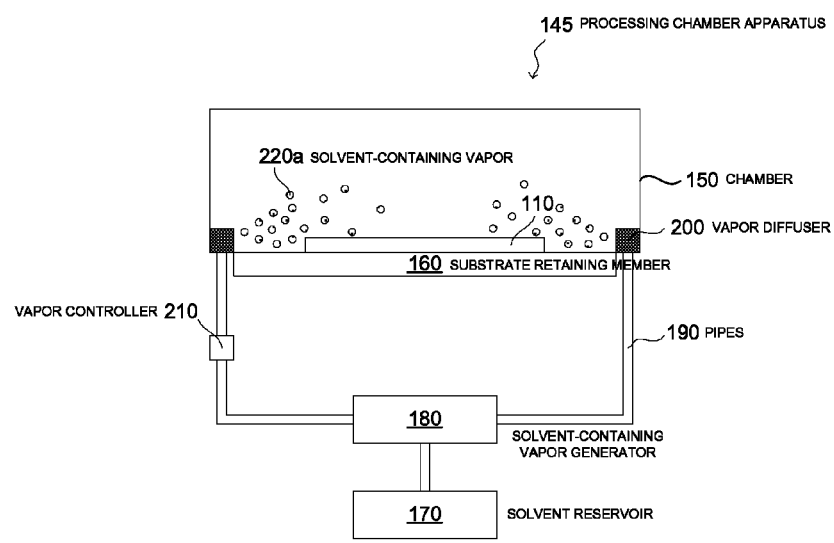
FIG. 3 is a cross-sectional view of one embodiment of a processing chamber apparatus employed in a cleaning process in which a solvent-containing vapor is generated and conducted to a substrate to be cleaned, according to various aspects of the present disclosure.

FIG. 3 is a cross-sectional view of one embodiment of a processing chamber apparatus 145 in which a solvent-containing vapor is generated and introduced into a chamber 150 to a workpiece or substrate 110 to be cleaned according to various aspects of the present disclosure. The processing chamber apparatus 145 may be a single-wafer processing chamber in which a substrate is disposed therein or a batch processing chamber in which multiple substrates are disposed therein for processing. In an embodiment of the present disclosure, the processing chamber apparatus 145 includes a chamber 150 for receiving the substrate 110 to be cleaned, a substrate retaining member 160 for supporting substrate 110, solvent reservoir 170 for storing a solvent-containing solution, a solvent-containing vapor generator 180 for generating a solvent-containing vapor 220a from a solvent-containing solution, and conduits or pipes 190 extending from the solvent-containing vapor generator 180 to chamber 150, wherein the conduits 190 are configured to carry the solvent-containing vapor into chamber 15. Some embodiments of the processing chamber apparatus 145 may include vapor diffusers 200 that receive the solvent-containing vapor from vapor generator 180 for diffusion into chamber 150. Vapor diffusers 200 provide for the solvent-containing vapor 220a to be sprayed on the exposed surface of substrate 110. The substrate 110 may be exposed to the solvent-containing vapor 220a by any appropriate processes. Some embodiments of the processing chamber apparatus 145 may include a vapor controller 210 for controlling the amount of the solvent-containing vapor 220a to be delivered into chamber or to the vapor diffusers 200.

Chamber 150 takes on various shapes and sizes, and in various embodiments. Chamber 150 may be a sealed chamber or un-sealed chamber. Chamber 150 is a pressure controlled chamber in some embodiments and in some embodiments, the pressure within chamber 150 is lower than 1 atmosphere. In some embodiments, the pressure within chamber 150 is at ambient pressure and in some embodiments, the pressure maintained within chamber 150 is greater than 1 atmosphere. Various pressure controllers (not shown) for controlling and/or maintaining the pressure in the chamber 150 are used in various embodiments. In some embodiments, chamber 150 is not a pressurized chamber.

In some embodiments, substrate retaining member 160 is capable of rotation so that the solvent-containing solution including any debris 140 flow outwardly due to centrifugal force. In some embodiments, substrate 110 is retained in a stationary manner during processing.

Although depicted as being outside chamber 150 in FIG. 3, in other embodiments, solvent-containing vapor generator 180 is disposed inside of chamber 150.

In a first step of the cleaning process, solvent-containing vapor 220a is generated by solvent-containing vapor generator 180, and introduced into chamber 150. In one embodiment, solvent-containing vapor 220a is generated by heating the solvent-containing solution using a heater (not shown) in solvent-containing vapor generator 180. In an exemplary embodiment, the solvent-containing solution is heated to between about 90 Celsius and about 100 Celsius, although higher or lower temperatures may be used in other embodiments. The heater may be built in the solvent-containing vapor generator 180 or may be located close to pipes 190, so that the efficiency in generating the solvent-containing vapor 220a is increased. Alternatively, the solvent-containing vapor 220a may be generated by other suitable methods in other embodiments, such as by high frequency oscillation of the solvent-containing solution, by changing the pressure of the solvent-containing solution, and the like.

Solvent-containing vapor 220a may include a vapor of a solvent-containing solution. The solvent-containing solution is a cleaning liquid in some embodiments that can remove and/or dissolve debris 140 and the solvent-containing solution is an etching liquid in other embodiments and the solvent-containing solution is used for various other functions in other embodiments. Examples of processing liquids include IPA (isopropyl alcohol), $NH_4OH$, KOH, TMAH (tetramethylammonium hydroxide), TBAH (tetrabutylammonium hydroxide), $H_2O$, $NH_4OH/H_2O_2/H_2O$, $NH_4OH/H_2O$, $HCl/H_2O_2/H_2O$, $HCl/H_2O$, $H_2O_4/H_2O_2$, $Hf/H_2O$, $Hf/H_2O_2/H_2O$, $Hf/NH_4/H_2O$, Acetic Acid mixture, $HNO_3/H_2O$, $HNO_3/HCl/H_2O$, and $H_3PO_4/H_2O$. The preceding list of chemicals is intended to be exemplary only, and not limiting. In an exemplary embodiment, the processing liquid includes deionized water.

In some embodiments, the solvent-containing solution includes a surfactant to enhance particle removal capability. The surfactant may be cationic, anionic, or nonionic surfactant. The surfactant may be a commercially available surfactant such as BASF C-2101, or any suitable surfactant. When the surfactant is put into the solvent-containing solution, it will readily dissolve if the surfactant concentration is low. The surfactant concentration may range from about 0.001 wt % to about 1.0 wt % in some embodiments.

In addition, solvent-containing vapor 220a may include steam. The solvent-containing solution in solvent-containing vapor 220a may range from about 0.1 weigh percent and about 20 weight percent, although different weight percents may be used. During the cleaning process, solvent-containing vapor 220a that is conducted into chamber 150 permeates into the voids or openings of debris 140.

Solvent-containing vapor 220a may be at the room temperature or at an elevated temperature, such as between 70 Celsius and about 90 Celsius, although different temperatures may be used in different embodiments. The solvent-containing vapor 220a may be introduced into chamber 150 for a duration, for example, between about 1 minute and about 15 minutes. In some embodiments, the time duration may be different. The pressure in chamber 150 during this time may be between 1 atmosphere and about 2 atmospheres, although different pressures may be used.

Figure 4:
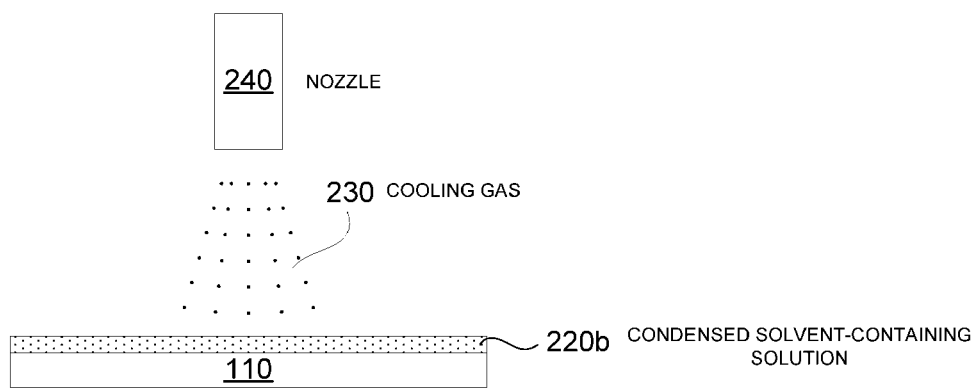
FIG. 4 is a cross-sectional view of one embodiment of a semiconductor structure in a cleaning process according to various aspects of the present disclosure, where a condensed solvent-containing solution on a substrate undergoes a cooling process.
Figure 5:
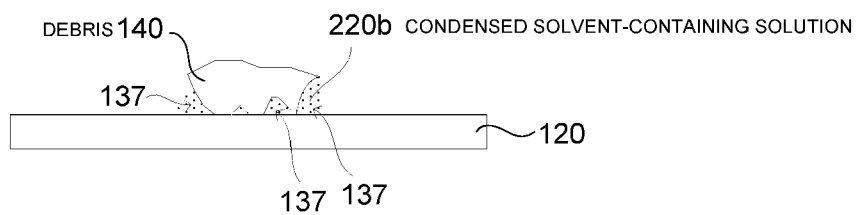
FIG. 5 is a cross-sectional magnified view of one embodiment of the semiconductor structure in FIG. 4 where condensed solvent vapor permeates voids or openings of debris or contaminants on the surface of a substrate.

Solvent-containing vapor 220a condenses as a condensed solvent-containing solution 220b on a surface of substrate 110, as shown in FIG. 4. The micro-droplets in the solvent-containing vapor 220a has better ability in penetrating into small gaps than liquid solvent that is sprayed on semiconductor devices or work pieces. FIG. 5 is a magnified view of a cross-section of a semiconductor structure 100 showing a debris 140 on underlying layers 120. Solvent-containing vapor 220a enters into the gaps, voids, or openings 137 of debris 140 and condenses as condensed solvent-containing solution 220b. The low surface tension of the solvent vapor makes it easier to diffuse into the gaps, voids, or openings 137 between the debris 140 and a surface of the underlying layers 120. The solvent-containing vapor 220a along with any additional pressurized gas, enables solvent-containing vapor 220a to overcome any liquid-air surface tensions, liquid-solid surface tensions, and/or solid-air surface tensions and completely fill the gaps, voids, or openings 137 in debris 140.

Returning back to FIG. 4, in a subsequent processing step, the semiconductor structure 100 is subject to a phase change process in which the liquid phase of the solvent-containing solution 220b is changed to a solid phase. According to one embodiment, this phase change can be accomplished by a cooling process. In a cooling process, a cooling gas 230 is sprayed by one or more nozzles 240 onto a surface of substrate 110 to thereby cool and freeze the condensed solvent-containing solution 220b, according to one embodiment. Alternatively, the substrate retaining member 160 can itself be cooled by applying a low temperature gas that thereafter cools the substrate 110 upon which the condensed solvent-containing solution 220b sits. In some other embodiments, the solvent-containing solution 220b can be cooled by a coolant compression process, an expansion process, or by electronic coolers.

By freezing the condensed solvent-containing solution 220b, the particle removal efficiency is increased because the net lift force on debris 140 is increased using volume expansion of frozen deionized water contained in the condensed solvent solution 220b. Examples of cooling gases, either in gaseous or liquid forms include nitrogen, argon, helium, hydrogen, clean dry air, or other inert gases. The preceding list of cooling gases is intended to be exemplary only, and not limiting. In one exemplary embodiment, the solvent solution 220b is cooled to a temperature of about 0 Celsius for from about 1 second to about 600 seconds.

In some other embodiments, changing the liquid phase of the solvent-containing solution 220b to a solid phase can also be accomplished by changing the pressure within the chamber 150. For example, for $H_2O$ at O Celsius by reducing the pressure in the processing chamber apparatus 145 to 1 ATM, liquid water changes to a solid (e.g., ice).

Figure 6:
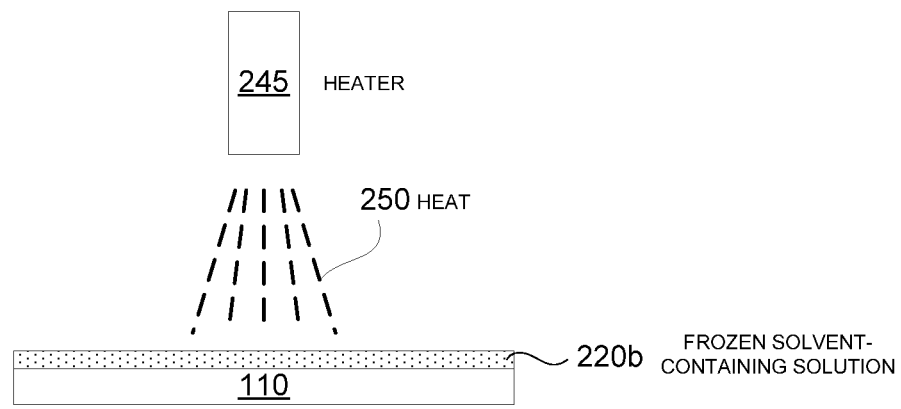
FIG. 6 is a cross-sectional view of one embodiment of a semiconductor structure in a cleaning process according to various aspects of the present disclosure, where a frozen solvent-containing solution on a substrate undergoes a heating process.

In a subsequent processing step in FIG. 6, the semiconductor structure 100 undergoes a heating process, according to one embodiment of the present disclosure. In a heating step, a heater 245 heats the substrate 110 to melt the frozen condensed solvent-containing solution 220b. In some embodiments, the substrate retaining member 160 may itself provide the heating of the target substrate. In an exemplary embodiment, the substrate is heated to between about 30 Celsius and about 60 Celsius for from about 1 second to about 300 seconds. In a further embodiment, the substrate 110 is heated to approximately 40 Celsius. In other embodiments, higher or lower temperatures may be used in order to melt the frozen solvent-containing solution 220b.

In some other embodiments, the frozen condensed solvent-containing solution 220b can be melted by changing the pressure with the chamber 150. For example, for $H_2O$ at O Celsius by increasing the pressure in the processing chamber apparatus 145 to 1 ATM, solid water (e.g., ice) changes to liquid water.

Figure 7:
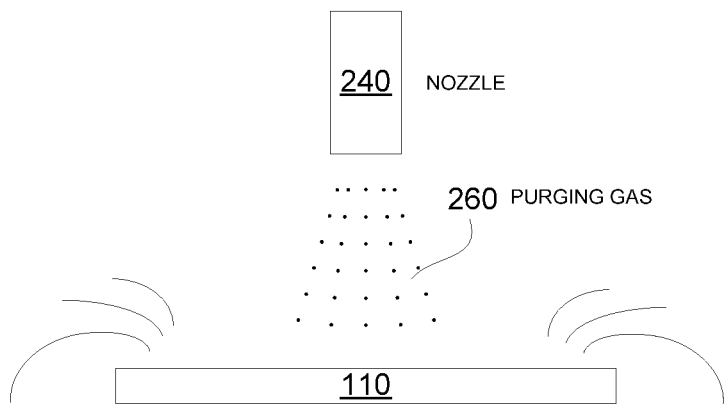
FIG. 7 is a cross-sectional view of one embodiment of a semiconductor structure in a cleaning process according to various aspects of the present disclosure, where a substrate undergoes a purging and spinning process to remove solvent-containing solution and debris or contaminants.

In a subsequent processing step in FIG. 7, the substrate 110 undergoes a purging and/or spinning process to remove the melted solvent-containing solution and debris or contaminants 140, according to one embodiment of the present disclosure. In a purging step, a purging gas 260 is sprayed by one or more nozzle 240 onto a surface of substrate 110 to substantially remove debris 140 and the melted solvent solution. In other embodiments, the substrate 110 is exposed to the purging gas 260 by any other suitable methods. Examples of purging gases include nitrogen, argon, helium, IPA vapor, air, or other inert gases or their mixtures. The preceding list of gases is intended to be exemplary only, and not limiting.

In addition to or simultaneously with the spraying of the purging gas 260 onto the substrate 110, the substrate 110 may be spun or rotated to shed off any remaining melted solvent solution and debris and contaminants. In one embodiment, the substrate 110 is spun as the purging gas 260 is provided to a surface of the substrate 110. In an embodiment, the substrate 110 may be rotated, for example, at approximately 800 rpm, during the spray. In another embodiment, the substrate 110 is rotated at approximately 754 rpm for about from 1 minute to about 5 minutes.

Advantages of one or more embodiments of the present disclosure may include one or more of the following.

In one or more embodiments, the particle removal efficiency in the present processing method compared to that of conventional methods is enhanced without causing pattern collapse on substrates.

In one or more embodiments, the low surface tension of solvent vapor makes it easier to diffuse into the voids between contaminants and a surface of the wafer.

In one or more embodiments, solvent consumption is lower using vaporized solvent compared to wet solvent processing methods.

In one or more embodiments, a cleaned surface reduces manufacturing cost, cycle time, and provides for higher production yields, when compared with traditional manufacturing processes. Further, the methods described therein can be easily implemented into current manufacturing process and technology, thereby lowering cost and minimizing complexity. Different embodiments may have different advantages, and no particular advantage is necessarily required of any embodiment.

The methods and apparatuses of the present disclosure apply to liquids used for cleaning, etching, and other processing purposes in the semiconductor manufacturing industry and any industry in which wet processing takes place and it is desirable for the wet processing liquid or vapor to completely fill various types of openings, trenches, and the like in patterned layers on a work piece, such as a semiconductor substrate or the gaps or openings in debris or contaminants.

The present disclosure has described various exemplary embodiments. According to one embodiment, a cleaning method using vaporized solvent is provided. A solvent-containing vapor is generated, wherein the solvent-containing vapor comprises a solvent. The solvent-containing vapor is conducted to a substrate having debris or contaminants to clean the substrate, wherein the solvent-containing vapor condenses to form a liquid on a surface of the substrate. The liquid phase of the solvent-containing vapor is changed to a solid phase. The solid phase of the solvent-containing vapor is changed back to a liquid phase. The substrate is spun dried to remove the solvent-containing vapor in liquid phase and any debris or contaminants.

According to another embodiment, a cleaning method using vaporized solvent includes placing a substrate into a chamber. A solvent-containing vapor from a solvent-containing solution is conducted into the chamber. During the step of conducting the solvent-containing vapor, the chamber is sealed. The solvent-containing vapor condenses as a condensed solvent-containing solution on a surface of the substrate, with the solvent-containing vapor capable of permeating into voids or openings of debris or contaminants on the surface of the substrate. The condensed solvent-containing solution is thereafter cooled to freeze the solution. The frozen solvent-containing solution is then heated to melt the solution. A purging gas is conducted into the chamber to remove the solvent-containing solution and the debris or contaminants.

According to yet another embodiment, an apparatus for cleaning a substrate includes a solvent-containing vapor generation chamber. The solvent-containing vapor generation chamber includes a reservoir for storing a solvent-containing solution. The chamber also includes a solvent-containing vapor generator for generating solvent-containing vapor from the solvent-containing solution. Also included in the chamber is a conduit that extends from the solvent-containing vapor generator to inside the solvent-containing vapor generation chamber, wherein the conduit is configured to carry the solvent-containing vapor into the chamber.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method of treating a substrate comprising:
   generating a solvent-containing vapor from a solvent-containing solution, the solvent-containing solution comprising a mixture of two or more solvents, wherein the solvent-containing vapor comprises the mixture of the two or more solvents;
   introducing the solvent-containing vapor into a chamber;
   contacting the solvent-containing vapor to a substrate in the chamber, wherein a surface of the substrate includes debris or contaminants thereon, wherein the solvent-containing vapor coats the surface of the substrate and the debris or contaminants thereon;
   condensing the solvent-containing vapor into a condensed solvent-containing solution, the condensed solvent-containing solution being in a liquid-phase;
   changing the condensed solvent-containing solution from the liquid phase to a solid phase to form a solvent-containing solid, wherein changing the condensed solvent-containing solution to the solvent-containing solid weakens contact between the substrate and the debris or contaminants thereon;
   changing the solvent-containing solid back to the condensed solvent-containing solution; and
   spin drying the substrate to remove the condensed solvent-containing solution and the debris or contaminants from the substrate.

2. The method of claim 1, wherein one of the solvents includes IPA, acetic acid, $NH_4OH$, KOH, TMAH (tetramethylammonium hydroxide), TBAH (tetrabutylammonium hydroxide), $NH_4OH/H_2O_2/H_2O$, $NH_4OH/H_2O$, $HCl/H_2O_2/H_2O$, $HCl/H_2O$, $H_2O_4/H_2O_2$, $Hf/H_2O$, $Hf/H_2O_2/H_2O$, $Hf/NH_4/H_2O$, $HNO_3/H_2O$, $HNO_3/HCl/H_2O$, and $H_3PO_4/H_2O$.

3. The method of claim 1, wherein the solvent-containing vapor permeates into voids or openings of the debris or contaminants on the substrate.

4. The method of claim 1, wherein the step of contacting the solvent-containing vapor to the substrate further comprises:

placing the substrate in the chamber, wherein the chamber is a sealed chamber; and introducing the solvent-containing vapor into the sealed chamber.

5. The method of claim 4, wherein the step of changing the condensed solvent-containing solution into the solvent-containing solid includes cooling the codensed solvent-containing solution and the step of changing the solvent-containing solid back to the condensed solvent-containing solution includes heating the solvent-containing solid.

6. The method of claim 4, wherein simultaneously with the step of spin drying the substrate, introducing a purging gas into the chamber.

7. The method of claim 6, wherein the purging gas includes IPA vapor, hydrogen, clean dry air, inert gases, and/or combinations thereof.

8. The method of claim 5, wherein the condensed solvent-containing solution is cooled to a temperature of about 0 Celsius for from about 1 second to about 600 seconds.

9. The method of claim 5, wherein the condensed solvent-containing solution is cooled by a cooling gas comprising hydrogen, and/or inert gases.

10. The method of claim 5, wherein the solvent-containing solid is heated to a temperature from about 5 Celsius to about 100 Celsius for from about 1 second to about 600 seconds.

11. A method of treating a substrate comprising:
placing a substrate into a processing chamber;
introducing a solvent-containing solution to a vapor generator chamber, the solvent-containing solution comprising a mixture of two or more solvents;
generating, in the vapor generator chamber, a solvent-containing vapor from the solvent-containing solution, the solvent-containing vapor comprising the mixture of the two or more solvents;
introducing the solvent-containing vapor from the vapor generator into the processing chamber, wherein during the step of introducing the solvent-containing vapor, the processing chamber is sealed, and the solvent-containing vapor condenses as a condensed solvent-containing solution on a surface of the substrate, with the solvent-containing vapor permeating into voids or openings of debris or contaminants on the surface of the substrate;
cooling the condensed solvent-containing solution to freeze the solution;
heating the frozen solvent-containing solution to melt the solution;
removing the debris and contaminants on the surface of the substrate; and
introducing a purging gas into the processing chamber.

12. The method of claim 11, wherein the solvent-containing vapor is generated by heating the solvent-containing solution and changing the pressure of the solvent-containing solution.

13. The method of claim 11, wherein the condensed solvent-containing solution is cooled to a temperature of about 0 Celsius for from about 1 second to about 600 seconds, and further wherein the condensed solvent-containing solution is cooled by a cooling gas comprising hydrogen, or inert gases.

14. The method of claim 11, wherein the frozen solvent-containing solution is heated to a temperature from about 5 Celsius to about 100 Celsius for from about 1 second to about 600 seconds.

15. The method of claim 11, wherein simultaneously with the step of introducing the purging gas into the processing chamber, further comprising:
spin drying the substrate to remove the solvent-containing solution and the debris or contaminants.

16. The method of claim 11, wherein the purging gas includes IPA vapor, clean dry air, or inert gases.

17. A method of treating a substrate comprising:
providing a solvent-containing solution comprising a mixture of two or more liquids;
generating a solvent-containing vapor from the solvent-containing solution, the solvent-containing vapor comprising the mixture of two or more liquids;
transporting the solvent-containing vapor into a chamber containing a substrate;
allowing the solvent-containing vapor to condense into a liquid on a surface of the substrate within the chamber;
freezing the liquid;
melting the frozen liquid on the surface of the substrate;
removing contaminants and debris from the surface of the substrate; and
purging the melted liquid from the chamber.

18. The method of claim 17, wherein the step of transporting the solvent-containing vapor into a chamber includes sealing the chamber.

19. The method of claim 17, wherein the step of generating a solvent-containing vapor from a solvent-containing solution includes a process selected from the group consisting of heating the solvent-containing solution and changing the pressure of the solvent-containing solution.

20. The method of claim 17 further comprising spin drying the substrate.

* * * * *